United States Patent
Sugiura

(10) Patent No.: US 8,818,298 B2
(45) Date of Patent: Aug. 26, 2014

(54) HIGH FREQUENCY SWITCH

(75) Inventor: Tsuyoshi Sugiura, Yokohama (JP)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 381 days.

(21) Appl. No.: 13/355,088

(22) Filed: Jan. 20, 2012

(65) Prior Publication Data

US 2013/0188650 A1    Jul. 25, 2013

(51) Int. Cl.
*H04B 1/44* (2006.01)
*H04B 1/52* (2006.01)
*H03K 17/16* (2006.01)

(52) U.S. Cl.
CPC .. *H04B 1/44* (2013.01); *H04B 1/52* (2013.01); *H03K 17/16* (2013.01)
USPC ............... 455/78; 455/83; 333/103

(58) Field of Classification Search
CPC .... H04B 1/005; H04B 1/0053; H04B 1/0056; H04B 1/007; H04B 1/406; H04B 1/44; H04B 1/52; H04B 1/58; H03H 7/46; H03H 7/48
USPC ........ 455/78, 80, 82, 83, 550.1, 552.1, 553.1, 455/575.1; 333/101, 103
See application file for complete search history.

(56) References Cited

U.S. PATENT DOCUMENTS

| 2009/0181630 | A1 | 7/2009 | Seshita et al. | |
| 2010/0073066 | A1* | 3/2010 | Seshita et al. | 327/427 |
| 2010/0304693 | A1* | 12/2010 | Uejima et al. | 455/83 |
| 2013/0260698 | A1* | 10/2013 | Nisbet et al. | 455/78 |
| 2014/0011463 | A1* | 1/2014 | Madan et al. | 455/78 |

FOREIGN PATENT DOCUMENTS

| JP | 2008-011320 A | 1/2008 |
| JP | 2008-017416 A | 1/2008 |
| JP | 2009-194891 A | 8/2009 |

OTHER PUBLICATIONS

Japanese Office Action issued in corresponding Japanese Application No. 2010-283748, dated Jun. 10, 2014, with English translation.

* cited by examiner

*Primary Examiner* — Thanh Le
(74) *Attorney, Agent, or Firm* — McDermott Will & Emery LLP

(57) ABSTRACT

There is provided a high frequency switch formed on an SOI substrate and having improved insertion loss characteristics in a multimode system. The high frequency switch includes: at least one first port; at least one second port; a common port; a first series switch; and a second series switch.

4 Claims, 2 Drawing Sheets

HIGH FREQUENCY SWITCH

BACKGROUND OF THE INVENTION

1. Field of the Invention

The present invention relates to a high frequency switch.

2. Description of the Related Art

Recently, the miniaturization of wireless communications apparatuses, such as mobile phones, or the like, has been rapidly undertaken. As an example of a method of miniaturizing a wireless communications apparatus, there is provided a method of miniaturizing a battery mounted in a wireless communications apparatus by reducing the power consumption thereof. The wireless communications apparatus includes a plurality of semiconductor integrated circuits provided therein, and a portion of the power supplied by the battery is consumed by these semiconductor integrated circuits. Among these semiconductor integrated circuits, there is provided a high frequency semiconductor switch (hereinafter, referred to as a "high frequency switch") switching a high frequency signal transfer path between an antenna and transmission/reception circuits. The high frequency switch does not consume a large amount of power. However, insertion loss in the high frequency switch may have a direct influence on power consumption in a transmission power amplifier of the transmission circuit.

As the high frequency switch, for example, a high frequency switch disclosed in the following Patent Document 1 has been known in the art. The high frequency switch disclosed in the Patent Document 1 is configured using a metal oxide semiconductor field effect transistor (MOSFET) formed on a silicon on insulator (SOI) substrate, thereby reducing power consumption in the high frequency switch (Patent Document 1: Japanese Patent Laid-Open No. 2009-194891).

However, in the high frequency switch disclosed in Patent Document 1, insertion loss characteristics in a multi-mode system in which a time division duplex system and a frequency division duplex system are mixed with each other has not been sufficiently considered.

SUMMARY OF THE INVENTION

An aspect of the present invention provides a high frequency switch formed on an SOI substrate and having improved insertion loss characteristics in a multimode system.

According to an aspect of the present invention, there is provided a high frequency switch including: at least one first port connected to a time division duplex system to input or output a high frequency signal; at least one second port connected to a frequency division duplex system to input or output the high frequency signal; a common port transmitting or receiving the high frequency signal input or output through the first or second port; a first series switch including at least one first field effect transistor (FET) and allowing the high frequency signal to be conducted or preventing the high frequency signal from being conducted between the first port and the common port according to a voltage applied to a first gate resistor connected to a gate of the first FET; and a second series switch including at least one second FET and allowing the high frequency signal to be conducted or preventing the high frequency signal from being conducted between the second port and the common port according to a voltage applied to a second gate resistor connected to a gate of the second FET and having a resistance value larger than that of the first gate resistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, a high frequency switch according to embodiments of the present invention will be described with reference to the accompanying drawings. The high frequency switch according to the embodiments of the present invention may be widely used in a high frequency switch for a wireless communications system such as a universal mobile telecommunications system (UMTS), a global system for mobile communications (GSM), or the like.

First Embodiment

Figure 1:
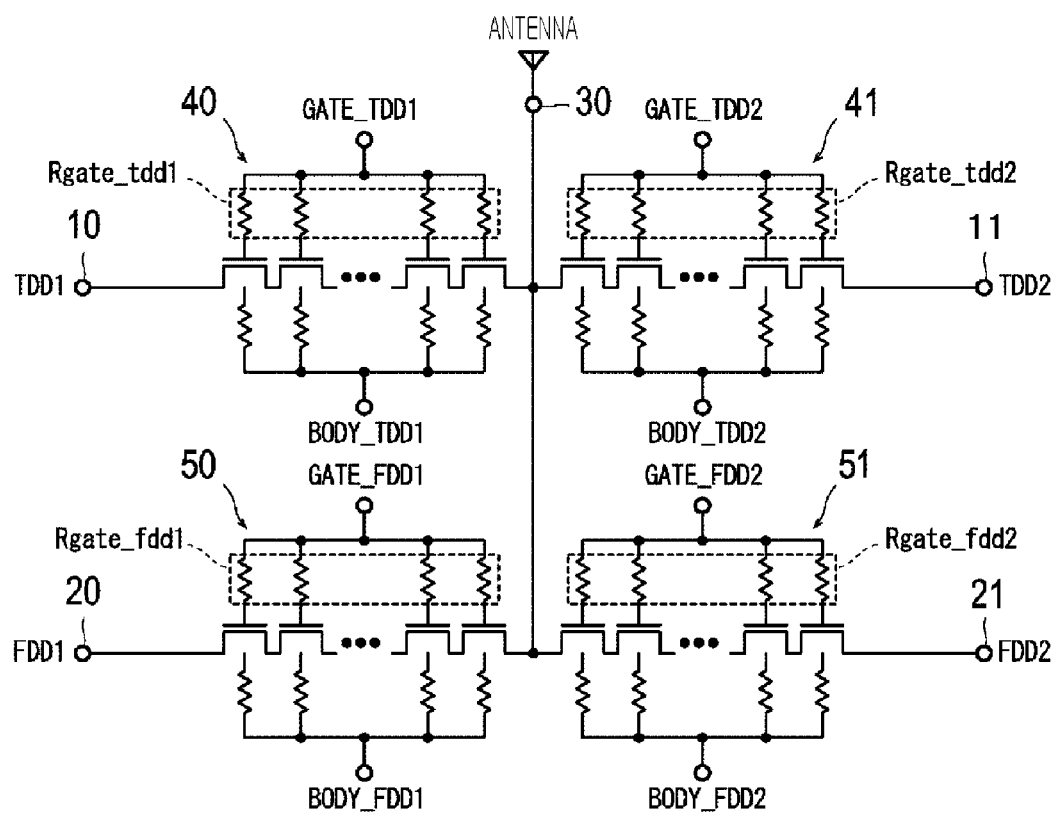
FIG. 1 is a circuit diagram of a high frequency switch according to a first embodiment of the present invention.

FIG. 1 is a circuit diagram of a high frequency switch according to a first embodiment of the present invention. In the high frequency switch according to the embodiment, a gate resistor of a switch connected to a frequency division duplex system (hereinafter, referred to as a FDD system) may be set to have a resistance value larger than that of a gate resistor of a switch connected to a time division duplex system (hereinafter, referred to as a TDD system).

As shown in FIG. 1, a high frequency switch 100 according to the embodiment may include time division duplex (TDD) ports 10 and 11, frequency division duplex (FDD) ports 20 and 21, a common port 30, TDD-side series switches 40 and 41, and FDD-side series switches 50 and 51.

The TDD ports 10 and 11, first ports, may be ports for inputting a high frequency signal from the TDD system or outputting a high frequency signal from an antenna to the TDD system. The TDD ports 10 and 11 may be connected to one signal terminals of the TDD-side series switches 40 and 41, respectively.

The FDD ports 20 and 21, second ports, may be ports for inputting a high frequency signal from the FDD system or outputting a high frequency signal from an antenna to the FDD system. The FDD ports 20 and 21 may be connected to one signal terminals of the FDD-side series switches 50 and 51.

The common port 30 may be a port for transmitting or receiving the high frequency signal. The common port 30 may be connected to the other signal terminals of the TDD-side series switches 40 and 41 and the other signal terminals of the FDD-side series switches 50 and 51.

The common port 30 may transmit the high frequency signal input through the TDD ports 10 and 11 or the FDD ports 20 or 21 or receive the high frequency signal output through the TDD ports 10 and 11 or the FDD ports 20 or 21.

Further, in the embodiment, the common port 30 may be connected directly to the antenna. However, the common port 30 may also be connected to the antenna through another component.

The TDD-side series switches 40 and 41, first series switches, may allow the high frequency signal to be conducted or may prevent the high frequency signal from being conducted between the TDD ports 10 and 11 and the common port 30.

The TDD-side series switch 40 may be connected between the TDD port 10 and the common port 30, and the TDD-side series switch 41 may be connected between the TDD port 11 and the common port 30.

Each of the TDD-side series switches 40 and 41 may include at least one field effect transistor (hereinafter, referred to as a FET) and allow the high frequency signal to be conducted or prevent the high frequency signal from being conducted between the TDD ports 10 and 11 and the common port 30 according to a voltage applied to a first gate resistor connected to a gate of the FET.

According to the embodiment shown in FIG. 1, each of the TDD-side series switches 40 and 41 includes a plurality of FETs having sources and drains connected in series with each other. According to the embodiment, the FETs of the TDD-side series switches 40 and 41 may be, for example, body contact type FETs. Therefore, when the TDD-side series switches 40 and 41 are turned on, the high frequency signal input or output through the TDD ports 10 and 11 may be transferred through the plurality of FETs of the TDD-side series switches 40 and 41 connected in series with each other. Here, the number of the FETs included in each of the TDD-side series switches 40 and 41 may be determined in consideration of electrical withstand voltage characteristics of the FET.

In addition, gates of the plurality of FETs may be connected to control terminals GATE_TDD1 and GATE_TDD2 controlling turn-on/off of the TDD-side series switches 40 and 41 through first gate resistors Rgate_tdd1 and Rgate_tdd2. Here, the first gate resistors Rgate_tdd1 and Rgate_tdd2 may have substantially the same resistance value (for example, about several ten kΩ). The control terminals GATE_TDD1 and TAGS_TDD2 may have a small positive or negative voltage applied thereto.

In addition, bodies of the plurality of FETs may be connected to BODY_TDD1 and BODY_TDD2 through resistors. BODY_TDD1 and BODY_TDD2 may have a small positive or negative voltage applied thereto.

The FDD-side series switches 50 and 51, second series switches, may allow the high frequency signal to be conducted or may prevent the high frequency signal from being conducted between the FDD ports 20 and 21 and the common port 30. The FDD-side series switch 50 may be connected between the FDD port 20 and the common port 30, and the FDD-side series switch 51 may be connected between the FDD port 21 and the common port 30.

Each of the FDD-side series switches 50 and 51 may include at least one FET, be connected to the gate of the FET, and allow the high frequency signal to be conducted or prevent the high frequency signal from being conducted between the FDD ports 20 and 21 and the common port 30 according to a voltage applied to a second gate resistor having a resistance value larger than that of the first gate resistor.

According to the embodiment shown in FIG. 1, each of the FDD-side series switches 50 and 51 includes a plurality of FETs having sources and drains connected in series with each other. According to the embodiment, the FETs of the FDD-side series switches 50 and 51 may be, for example, body contact type FETs. Therefore, when the FDD-side series switches 50 and 51 are turned on, the high frequency signal input or output through the FDD ports 20 and 21 may be transferred through the plurality of FETs of the FDD-side series switches 50 and 51 connected in series with each other. Here, the number of FETs included in each of the FDD-side series switches 50 and 51 may be determined in consideration of electrical withstand voltage characteristics of the FET.

In addition, gates of the plurality of FETs are connected to control terminals GATE_FDD1 and GATE_FDD2 controlling turn-on/off of the FDD-side series switches 50 and 51 through the second gate resistors Rgate_fdd1 and Rgate_fdd2. Here, the second gate resistors Rgate_fdd1 and Rgate_fdd2 may have substantially the same resistance value (for example, about several hundred kΩ). The control terminals GATE_FDD1 and GATE_FDD2 may have a small positive or negative voltage applied thereto.

In addition, bodies of the plurality of FETs may be connected to BODY_FDD1 and BODY_FDD2 through resistors. BODY_FDD1 and BODY_FDD2 may have a small positive or negative voltage applied thereto.

In the high frequency switch 100 according to the embodiment configured as described above, the second gate resistors of the FDD-side switches 50 and 51 may be set to have a resistance value larger than those of the first gate resistors of the TDD-side series switches 40 and 41. An operation of the high frequency switch 100 according to the embodiment configured as described above will be described below.

The high frequency switch 100 according to the embodiment may secure a high frequency signal transfer path between one of the TDD ports 10 and 11 and the FDD ports 20 and 21, and the common port 30.

For example, in the case in which the high frequency signal input from the TDD system to the TDD port 10 is transmitted from the antenna, a positive voltage is applied to the control terminal GATE_TDD1 of the TDD-side series switch 40 to turn on the TDD-side series switch 40. Meanwhile, a negative voltage is applied to the control terminal GATE_TDD2 of the TDD-side series switch 41 and the control terminals GATE_FDD1 and GATE_FDD2 of the FDD-side series switches 50 and 51 to turn off the TDD-side series switch 41 and the FDD-side series switches 50 and 51.

As a result, the high frequency signal may be conducted between the TDD port 10 and the common port 30, while the high frequency signal may be prevented from being conducted between the TDD port 11 and the common port 30. Therefore, the high frequency signal transfer path may be secured between the TDD port 10 and the common port 30, such that a transmission signal input from the TDD system to the TDD port 10 may be transferred to the antenna through the common port 30.

Hereinbefore, a case of securing the high frequency signal transfer path between the TDD port 10 and the common port 30 has been described. With respect to the TDD port 11 and the FDD ports 20 and 21, a high frequency signal transfer path may also be secured between each of the TDD port 11 and the FDD ports 20 and 21 and the common port 30 by controlling turn-on/off of the TDD-side series switches 40 and 41 and the FDD-side series switches 50 and 51. Therefore, the high frequency signal may be transmitted or received between the TDD system or the FDD system connected to any one of the TDD ports 10 and 11 and the FDD ports 20 and 21, and the antenna connected to the common port 30. Hereinafter, operational characteristics of the TDD-side series switches 40 and 41 and the FDD-side series switches 50 and 51 will be described in detail.

In general, in the TDD system, communication channels are temporally and minutely divided, and transmission or reception may be performed in each time section. Therefore, since the transmission and the reception are rapidly switched in the TDD system, satisfactory switching speed characteristics may be required in the FET included in the TDD-side series switches 40 and 41.

The switching speed may depend on the resistance value of the gate resistor connected to the FET. More specifically, as a time constant determined by the resistance value of the gate resistor and a capacitance value of the gate is reduced, the switching speed may be increased. Therefore, when it is assumed that the capacitance value of the gate is constant, the lower the resistance value of the gate, the higher the switching speed. According to the embodiment, the resistance values of the first gate resistors of the TDD-side series switches 40 and 41 may be set to satisfy specifications for a switching speed between transmission and reception of the TDD system by way of example.

Meanwhile, in the FDD system, since it is not required to rapidly perform switching between transmission and the reception as in the TDD system, a switching speed in the FDD system may be set to decrease as compared to the switching speed in the TDD system. Therefore, the second gate resistors of the FDD-side series switches 50 and 51 may be set to have a resistance value larger than those of the first gate resistors of the TDD-side series switches 40 and 41. Since the second gate resistors are set to have a large resistance value to cause a reduction in a gate current of the FET, insertion loss characteristics in the FDD-side series switches 50 and 51 may be improved. As a result, power consumption of a transmission power amplifier of a transmission circuit may be reduced. According to the embodiment, the second gate resistors may be set to have a large resistance value within a limited range of switching speed of the FDD system, thereby improving the insertion loss characteristics.

As described above, the above-mentioned embodiment of the present invention may achieve the following effects.

(a) With the high frequency switch according to the embodiment, the insertion loss characteristics of the FDD-side series switch may be improved while the switching speed characteristics of the TDD-side series switch may be maintained to be satisfactory. As a result, the power consumption of the transmission power amplifier of the transmission circuit in a multi-mode system may be reduced.

Second Embodiment

According to the first embodiment of the present invention, the second gate resistors of the FDD-side series switches are set to have a resistance value larger than those of the first gate resistors of the TDD-side series switches. A high frequency switch according to a second embodiment of the present invention may include a TDD-side shunt switch and a FDD-side shunt switch, in addition to the configuration according to the first embodiment of the present invention, wherein a fourth gate resistor of the FDD-side shunt switch is set to have a resistance value larger than that of a third gate resistor of the TDD-side shunt switch.

Figure 2:
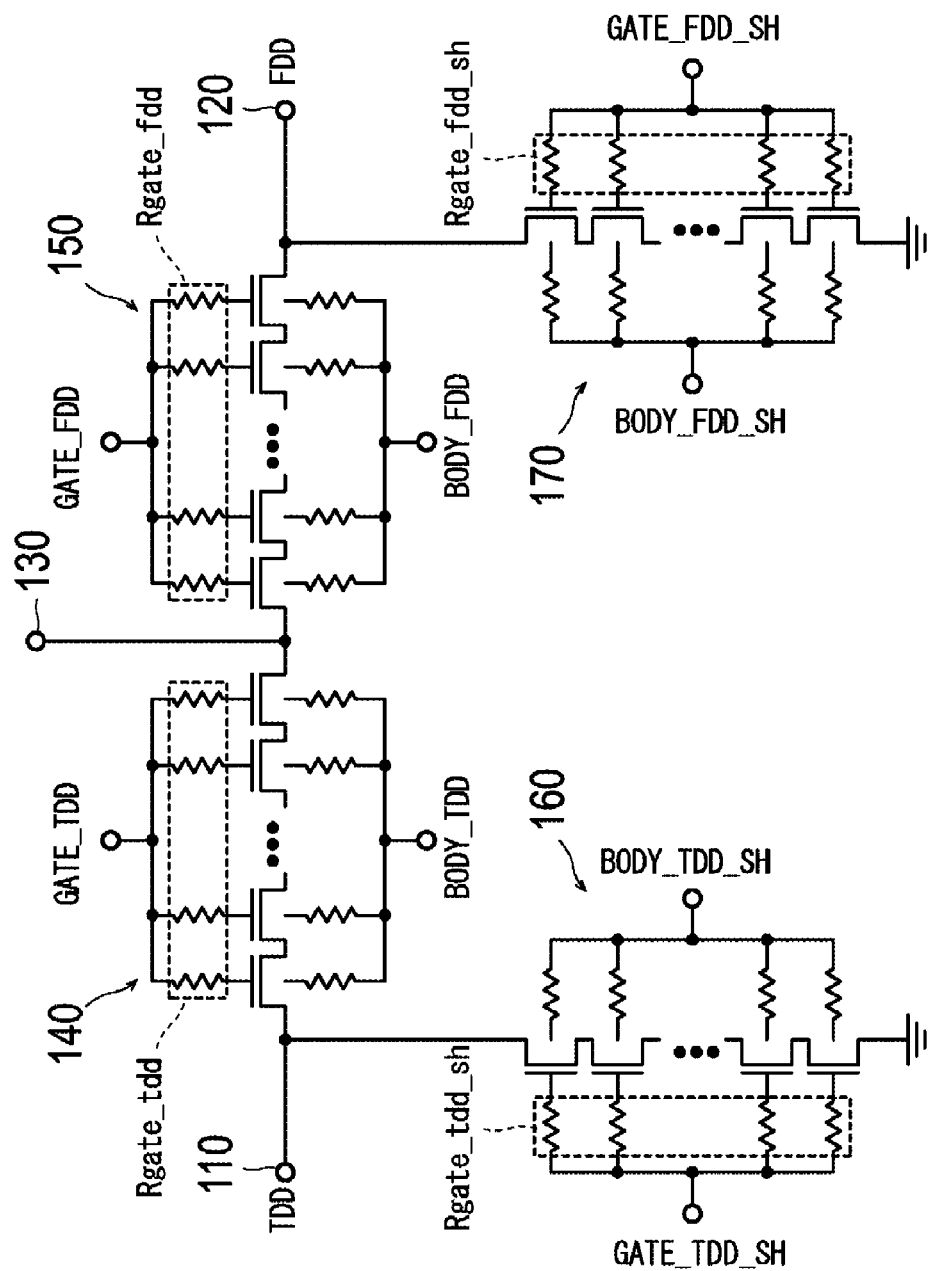
FIG. 2 is a circuit diagram of a high frequency switch according to a second embodiment of the present invention.

FIG. 2 is a circuit diagram of a high frequency switch according to a second embodiment of the present invention. As shown in FIG. 2, a high frequency switch 200 according to the embodiment may include a TDD port 110, a FDD port 120, a common port 130, a TDD-side series switch 140, a FDD-side series switch 150, a TDD-side shunt switch 160, and a FDD-side shunt switch 170.

Since the TDD port 110, the FDD port 120, the common port 130, the TDD-side series switch 140, and the FDD-side series switch 150 have the same configurations as those of the high frequency switch 100 according to the first embodiment of the present invention, a description thereof will be omitted.

The TDD-side shunt switch 160, a first shunt switch, may allow a high frequency signal to be conducted or prevent the high frequency signal from being conducted between the TDD port 110 and a ground. The TDD-side shunt switch 160 may be connected between the first port 110 and the ground. The TDD-side shunt switch 160 may include at least one FET and allow a high frequency signal to be conducted or prevent the high frequency signal from being conducted between the TDD port 110 and the ground according to a voltage applied to the third gate resistor connected to a gate of the FET.

According to the embodiment shown in FIG. 2, the TDD-side shunt switch 160 includes a plurality of FETs having sources/drains connected in series with each other. According to the embodiment, the FETs of the TDD-side shunt switch 160 may be, for example, body contact type FETs. Therefore, when the TDD-side shunt switch 160 is turned on, a high frequency signal input or output through the TDD port 110 may be transferred to the ground through the plurality of FETs of the TDD-side shunt switch 160 connected in series with each other. As a result, unnecessary leakage power may be absorbed in the ground, such that isolation characteristics at a TDD-side may be improved.

Here, the number of FETs included in the TDD-side shunt switch 160 may be determined in consideration of electrical withstand voltage characteristics of the FET.

In addition, gates of the plurality of FETs may be connected to a control terminal GATE_TDD_SH controlling turn-on/off of the TDD-side shunt switch 160 through the third gate resistor Rgate_tdd_sh. Here, the third resistor may have substantially the same resistance value as that of the first gate resistor. The control terminal GATE_TDD_SH may have a small positive or negative voltage applied thereto.

In addition, bodies of the plurality of FETs may be connected to BODY_TDD_SH through the resistors. BODY_TDD_SH may have a small positive or negative voltage applied thereto.

The FDD-side shunt switch 170, a second shunt switch, may allow a high frequency signal to be conducted or prevent the high frequency signal from being conducted between the FDD port 120 and a ground. The FDD-side shunt switch 170 may be connected between the second port 120 and the ground. The FDD-side shunt switch 170 may include at least one FET and allow the high frequency signal to be conducted or prevent the high frequency signal from being conducted between the FDD port 120 and the ground according to a voltage applied to a fourth gate resistor connected to a gate of the FET.

According to the embodiment shown in FIG. 2, the FDD-side shunt switch 170 includes a plurality of FETs having sources/drains connected in series with each other. According to the embodiment, the FETs of the FDD-side shunt switch 170 may be, for example, body contact type FETs. Therefore, when the FDD-side shunt switch 170 is turned on, a high frequency signal input or output through the FDD port 120 may be transferred to the ground through the plurality of FETs of the FDD-side shunt switch 170 connected in series with each other. As a result, unnecessary leakage power may be absorbed in the ground, such that isolation characteristics at a FDD-side may be improved.

Here, the number of FETs included in the FDD-side shunt switch 170 may be determined in consideration of electrical withstand voltage characteristics of the FET.

In addition, gates of the plurality of FETs may be connected to a control terminal GATE_FDD_SH controlling turn-on/off of the FDD-side shunt switch 170 through a fourth gate resistor Rgate_fdd_sh. Here, the fourth gate resistor may have substantially the same resistance value as that of the second gate resistor. The control terminal GATE_FDD_SH may have a small positive or negative voltage applied thereto.

In addition, bodies of the plurality of FETs may be connected to BODY_FDD_SH through the resistors. BODY_FDD_SH may have a small positive or negative voltage applied thereto.

In the high frequency switch 200 according to the embodiment configured as described above, the second gate resistor of the FDD-side series switch 150 may be set to have a resistance value larger than that of the first gate resistor of the TDD-side series switch 140, and the fourth gate resistor of the FDD-side shunt switch 170 may be set to have a resistance value larger than that of the third resistor of the TDD-side shunt switch 160.

As described above, the foregoing embodiment may achieve the following effects in addition to effects according to the first embodiment of the present invention.

(b) With the high frequency switch according to the embodiment, the insertion loss characteristics of the FDD-side shunt switch may be improved while the switching speed characteristics of the TDD-side shunt switch may be maintained to be satisfactory. As a result, the power consumption of the transmission power amplifier of the transmission circuit in the multi-mode system may be reduced.

As described above, the high frequency switch according to the embodiments of the present invention has been described. However, the embodiments may be appropriately added, modified, and omitted by those skilled in the art within the scope of the present invention.

For example, in the first embodiment of the present invention, a case in which the high frequency switch has two TDD-side series switches and two FDD-side series switches has been described. Further, in the second embodiment of the present invention, a case in which the high frequency switch has a TDD-side series switch, a FDD-side series switch, a TDD-side shunt switch, and a FDD-side shunt switch has been described. However, the number of switches included in the high frequency switch is not limited thereto.

In addition, in the first and second embodiment of the present invention, a case in which the body contact type FET is used as the FET has been described. However, the present invention is not limited to a case in which the FET is the body contact type FET, but may also be applied to a case in which the FET is a floating body type FET.

As set forth above, with the high frequency switch according to the embodiments of the present invention, insertion loss characteristics of a switch connected to a frequency division duplex system can be improved while switching speed characteristics of a switch connected to a time division duplex system can be maintained to be satisfactory. As a result, power consumption of a transmission power amplifier of a transmission circuit in a multi-mode system can be reduced.

What is claimed is:

1. A high frequency switch comprising:
   at least one first port connected to a time division duplex system to input or output a high frequency signal;
   at least one second port connected to a frequency division duplex system to input or output the high frequency signal;
   a common port transmitting or receiving the high frequency signal input or output through the first or second port;
   a first series switch including at least one first field effect transistor (FET) and allowing the high frequency signal to be conducted or preventing the high frequency signal from being conducted between the first port and the common port according to a voltage applied to a first gate resistor connected to a gate of the first FET; and
   a second series switch including at least one second FET and allowing the high frequency signal to be conducted or preventing the high frequency signal from being conducted between the second port and the common port according to a voltage applied to a second gate resistor connected to a gate of the second FET and having a resistance value larger than that of the first gate resistor.

2. The high frequency switch of claim 1, further comprising:
   a first shunt switch including at least one third FET and allowing the high frequency signal to be conducted or preventing the high frequency signal from being conducted between the first port and a ground according to a voltage applied to a third gate resistor connected to a gate of the third FET; and
   a second shunt switch including at least one fourth FET and allowing the high frequency signal to be conducted or preventing the high frequency signal from being conducted between the second port and the ground according to a voltage applied to a fourth gate resistor connected to a gate of the fourth FET and having a resistance value larger than that of the third gate resistor.

3. The high frequency switch of claim 2, wherein the common port is connected to an antenna.

4. The high frequency switch of claim 1, wherein the common port is connected to an antenna.

* * * * *